Nov. 24, 1964 P. K. TIEN 3,158,819

TRAVELING ACOUSTIC WAVE AMPLIFIER UTILIZING
PIEZOELECTRIC MATERIAL
Filed April 26, 1961

INVENTOR
P. K. TIEN
BY David P. Kelley
ATTORNEY

United States Patent Office 3,158,819

Patented Nov. 24, 1964

3,158,819

TRAVELING ACOUSTIC WAVE AMPLIFIER UTILIZING A PIEZOELECTRIC MATERIAL

Ping K. Tien, Chatham Township, Morris County, N.J., assignor to Bell Telephone Laboratories, Incorporated, New York, N.Y., a corporation of New York Filed Apr. 26, 1961, Ser. No. 105,679
8 Claims. (Cl. 330—35)

Figure 1:
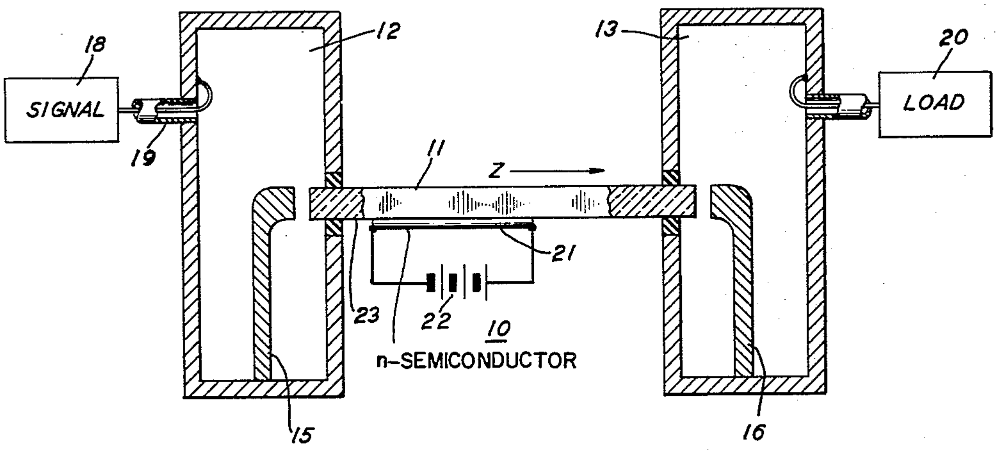

This invention relates to microwave frequency amplifiers, and more particularly to devices for amplifying microwave frequency acoustic type waves.

Devices utilizing acoustic wave propagation in solids, such as the acoustic delay line and the mechanical wave filter, have become increasingly important for many varied applications. These devices are generally made of a piezoelectric substance such as quartz, which will propagate an acoustic wave when excited by appropriate electric fields. For microwave frequency applications, the acoustic waves are usually excited by electric field produced within a cavity resonator, which, in turn, is excited by an electromagnetic wave.

It is often necessary that such microwave frequency acoustic waves be of a relatively high intensity for their proper utilization. For example, acoustic waves may be used to modulate light, providing the acoustic wave is of a sufficiently high intensity. Acoustic delay lines are frequently used in computers, in which case the acoustic waves must be of a sufficiently high power to compensate for relatively high losses. Extremely high power microwave frequency acoustic waves can further be used for such purposes as cleaning and cooking.

Producing a high-power microwave frequency acoustic wave is difficult for three reasons: it is generally impractical to amplify an acoustic wave directly; high frequency electromagnetic waves are difficult to amplify; it is difficult to excite an acoustic wave with a high-power electromagnetic wave.

Microwave frequency electromagnetic waves are usually amplified by electron beam devices such as the traveling wave tube and the klystron. These devices are often cumbersome for many reasons, notably the necessity of electron beam focusing apparatus. Even when these electromagnetic waves are amplified, the useable power of any microwave used for exciting an acoustic wave is limited. If the power of the electric fields applied to a piezoelectric substance is too high, the electric fields will produce a glow discharge or an arc discharge, and the acoustic wave will not be excited. There is, therefore, an upper limit on the power of the acoustic wave that can be excited by electromagnetic waves.

It is an object of this invention, therefore, to provide direct amplification of an acoustic wave propagating in a solid.

Acoustic waves propagating in solids can be converted to electromagnetic waves by methods known in the art. Hence, a device for amplifying high frequency acoustic waves can indirectly be used for amplifying high frequency electromagnetic waves.

Accordingly, it is a collateral object of this invention to amplify high frequency electromagnetic waves without necessitating the use of cumbersome and complicated structures.

These and other objects of my invention are attained in an illustrative embodiment thereof comprising a piezoelectric slab and a cavity resonator having a central conductor. The slab protrudes into the resonator with one end adjacent the central conductor. When the resonator is excited, electric fields produced between the central conductor and the slab excite an acoustic wave in the slab.

It is a feature of this invention that part of the piezoelectric slab be coated with a semi-conductive film. The film is biased such that electrons flow therein in the direction of the acoustic wave propagation. Both the acoustic wave and the electron flow produce electric fields which are in close proximity and which are capable of interacting with each other. When this interaction takes place, some of the kinetic energy of the electron flow is converted into high frequency electric field energy associated with the acoustic wave, which, in turn, produces an amplification of the acoustic wave.

It is another feature of this invention that the semiconductive film is biased at such a predetermined potential that the electron velocity therein slightly exceeds the velocity of the acoustic wave in the piezoelectric slab.

Figure 2:
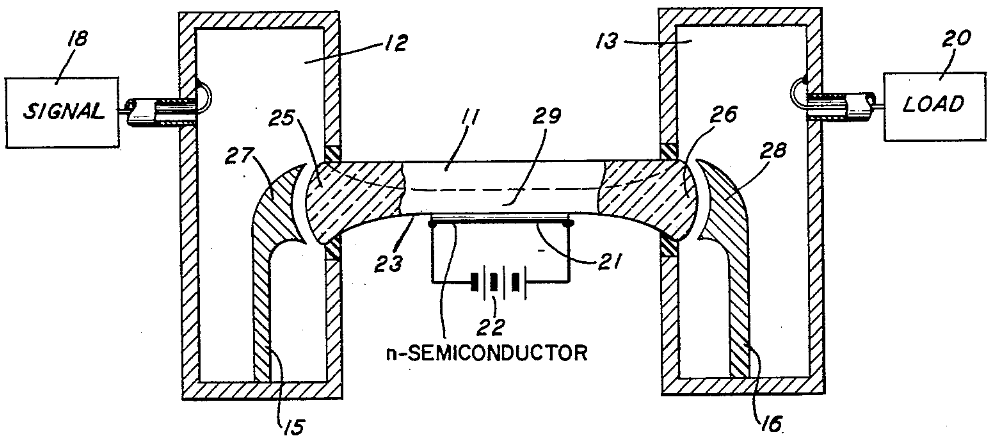

These and other objects and features of my invention will be more clearly understood with reference to the following detailed description, taken in conjunction with the accompanying drawing, in which:

FIG. 1 is a schematic view of one illustrative embodiment of this invention; and FIG. 2 is a schematic view of another illustrative embodiment of this invention.

Referring now to FIG. 1, there is shown a traveling acoustic wave amplifier 10 embodying the principles of this invention. Located at opposite ends of a piezoelectric slab 11, are an input resonator 12 and an output resonator 13. Central conductors 15 and 16 are located respectively within resonators 12 and 13.

Resonator 12 is connected to a source 18 of electromagnetic signal energy by means of a coaxial cable 19. When resonator 12 is excited by wave energy from source 18, electric fields of the signal frequency are produced between central conductor 15 and piezoelectric slab 11. These fields excite an acoustic wave in slab 11 which propagates in the $z$ direction as indicated by the arrow. In the embodiment shown, the piezoelectric slab is "$x$-cut" so that its major longitudinal axis is its $z$ crystallographic axis. As is known, electric fields associated with the propagating acoustic wave will then have large components parallel with the $z$ axis.

The acoustic wave propagating in slab 11 travels much slower than the velocity of light, which is the reason it can be used as a delay line, the length of slab 11 being adjusted to provide the amount of delay desired. The output resonator 13 then converts the acoustic wave into electromagnetic wave energy by the reverse process that occurred in resonator 12, i.e., the acoustic wave excites electric fields between slab 11 and central conductor 16, which, in turn, excites an electromagnetic wave within resonator 13 that is transmitted to an appropriate load 20.

In accordance with the present invention there is provided a thin semi-conductive film 21, along part of the piezoelectric slab 11, which, as will be explained hereinafter, amplifies the acoustic wave.

The film 21 is, in the embodiment of FIG. 1, an n-type semi-conductor and is biased as shown by a D.C. voltage source 22. Because the right end of the film is biased positively, electrons will flow in the film in the same direction as the acoustic wave, that is, in the $z$ direction.

Due to fringing effects, large components of the high frequency electric fields associated with the acoustic wave must necessarily penetrate the semi-conductive film 21. As mentioned previously, these components are directed along the $z$ axis, and are therefore capable of modulating the electron flow in the film, which is also directed along the $z$ axis. Such modulation produces space-charge waves in the semi-conductive film 21 which are capable of coupling with the electric fields accompanying the acoustic wave. Under certain conditions, this coupling may operate to present a negative resistance to the acoustic wave, with resulting amplification thereof, the energy for amplification being ultimately derived from D.C. source 22. This can be appreciated from the following detailed considerations.

An acoustic wave propagates in a solid through successive compression and rarefaction of the density of the solid. The wave propagation in slab 11 can therefore be expressed as:

$$\rho=\rho_0+\rho_1 e^{j(\omega t-\beta z)} \quad (1)$$

where $\rho$ is the net density of the slab, $\rho_0$ is the normal density of the slab, $\rho_1$ is the density component due to displacement by the acoustic wave, $e$ is the base of the natural logarithm, $j$ is $\sqrt{-1}$, $\omega$ is the angular frequency of the acoustic wave, $t$ is time, $\beta$ is the phase constant of the acoustic wave, and $z$ is distance. This wave propagation results in a storage of mechanical energy per unit of distance that is given by:

$$\tfrac{1}{2} cs^2 A \quad (2)$$

where $c$ is the elastic constant of the slab, $s$ is the strain produced by the acoustic wave and A is the cross-sectional area of the slab. If the acoustic wave is concentrated as a beam in one portion of the slab, as by methods that will be discussed hereinafter, A is the cross-sectional area of the acoustic beam. The electrical energy per unit distance associated with the acoustic wave equals the mechanical energy per unit distance times the square of the electromechanical coupling constant, or:

$$\tfrac{1}{2}\epsilon E^2=\tfrac{1}{2}k^2cs^2A \quad (3)$$

where E is the electric field associated with the acoustic wave, $\epsilon$ is the dielectric constant of the slab, and $k$ is the electromechanical coupling constant of the slab. This electrical energy is capable of modulating the electron flow in the semi-conductive film.

The modulation of the electron flow in the semi-conductor by the high frequency electric fields can be expressed by the equation:

$$n=n_0+n_1 e^{j(\omega t-\beta z)} \quad (4)$$

where $n$ is the total number of free electrons per unit of volume, $n_0$ is the number of free electrons per unit of volume due to the D.C. bias, $n_1$ is the number of free electrons per unit of volume due to the A.C. modulation. The electric fields associated with current flow in the semi-conductor are given by:

$$E=E_0+E_1 e^{j(\omega t-\beta z)} \quad (5)$$

where $E_0$ is the D.C. electric field component, and $E_1$ is the A.C. component. The D.C. current velocity in the semi-conductor is:

$$V_0=-\mu E_0 \quad (6)$$

where $\mu$ is the mobility of the semi-conductor. The phase velocity of the A.C. component is:

$$v_1=-\mu E_1 \quad (7)$$

The A.C. current flowing in the semi-conductor is:

$$i_1=(-\mathrm{e})n_0v_1+(-\mathrm{e})n_1v_0 \quad (8)$$

where e is the charge on an electron.

The continuity equation (or the equation of conservation of charge) states that if current changes with distance, charge must accummulate or decrease. In one dimension, this leads to the relation:

$$(-\mathrm{e})\frac{\partial n}{\partial t}=-\frac{\partial i_1}{\partial z} \quad (9)$$

Integrating by the use of Equations 4 and 8 gives:

$$-(\mathrm{e})j\omega n_1=j\beta i_1 \quad (10)$$

or:

$$n_1=-\frac{\beta}{\mathrm{e}\omega}i_1 \quad (11)$$

$\beta$ is defined as:

$$\beta=\frac{\omega}{v_s} \quad (12)$$

where $v_s$ is the velocity of the sound wave in the piezoelectric slab.

From Equations 11 and 12:

$$n_1=-\frac{1}{\mathrm{e}\,v_s}i_1 \quad (13)$$

From Equations 6 and 7, 8 can be rewritten as:

$$i_1=\mathrm{e}(n_0\mu E_1+n_1\mu E_0) \quad (14)$$

From Equation 13:

$$i_1=\mathrm{e}\left(n_0\mu E_1-\frac{\mu E_0}{\mathrm{e}v_s}i_1\right) \quad (15)$$

$$i_1=\left(1+\frac{\mu E_0\mathrm{e}}{\mathrm{e}\,v_s}\right)=n_0\mathrm{e}\mu E_1 \quad (16)$$

$$i_1=\frac{n_0\mathrm{e}\mu E_1}{1+\frac{\mu E_0}{v_s}} \quad (17)$$

From Equation 6:

$$i_1=\frac{n_0\mathrm{e}\mu E_1}{1-\frac{v_0}{v_s}} \quad (18)$$

or $$E_1i_1=\frac{n_0\mathrm{e}\mu E_1^2}{1-\frac{v_0}{v_s}} \quad (19)$$

The quantity $E_1i_1$ represents the power supplied by the acoustic wave to the electron flow during the modulation process. If $v_0$ is slightly larger than $v_s$, this quantity will be negative and acoustic power will be generated at the expense of the kinetic energy of the electrons.

The average power generated per unit of distance is:

$$\tfrac{1}{2}A'E_1i_1=\frac{\tfrac{1}{2}n_0\mathrm{e}\mu E_1^2A'}{1-\frac{v_0}{v_s}} \quad (20)$$

where A′ is the cross-sectional area of the semi-conductive film. The gain (in nepers) per unit of distance of the acoustic wave is equal to the average power generated divided by twice the power flow of the acoustic wave.

The power flow of the acoustic wave is equal to the mechanical energy stored by the wave per unit of distance times the velocity of the wave:

$$\tfrac{1}{2}cs^2Av_s=1/k^2\epsilon E_1^2v_sA \quad (21)$$

From 20 and 21, the gain per unit of distance is:

$$\frac{\dfrac{\tfrac{1}{2}n_0\mathrm{e}\mu E_1^2A'}{1-v_0/v_s}}{1/k^2\tfrac{1}{2}\epsilon E_1^2v_sA}=\frac{n_0\mathrm{e}\mu A'k^2}{\epsilon A(v_0-v_s)}=\frac{\text{nepers}}{\text{meter}} \quad (22)$$

The minus sign before the fraction forming the left-hand side of Equation 22 results from the fact that the power $E_1i_1$ supplied by the acoustic wave to the electron flow must be negative for a positive gain of the acoustic wave energy.

Equation 22 can be rewritten in terms of gains of decibels per meter:

$$\frac{\text{db}}{\text{meter}}=8.686\frac{\text{nepers}}{\text{meter}}=\frac{\sigma A'k^2}{\epsilon A(v_0-v_s)} \quad (23)$$

where $\sigma$ is the conductivity of the semi-conductor. The dimensions given are those of the MKS system. The constants $\sigma$, $k$, $\epsilon$ and $v_s$ depend upon the materials used and are readily determinable by workers in the art. The D.-C. current velocity $v_0$ is a function of the voltage on battery 22 and varies as:

$$v_0=\frac{\mu V}{L} \quad (24)$$

where V is the voltage on battery 22, and L is the length of the semi-conductor.

For purposes of simplicity, the effects of space-charge forces and thermal forces on the electrons have been neglected. Equation 23 indicates that gain is possible and that maximum gain will be achieved if $v_0$ is just a trifle larger than $v_s$. In practice, however, it is sometimes desirable to make $v_0$ appreciably higher than $v_s$. At higher frequencies the thermal velocity of the electrons has the same effect as to increase the space-charge forces between the electrons. It is well known in the theory of traveling wave tubes that as space-charge forces increase, the D.–C. velocity $v_0$ for maximum gain also increases. Detailed formulations taking space-charge forces and thermal velocities into account are considered to be too complex to warrant discussion. A typical computation shows that the ratio of $v_0$ to $v_s$ should be 1.1 for optimum gain at a frequency of 1 kmc. At 10 kmc., the same gain requires that $v_0/v_s$ be approximately 1.5. The higher $v_0$ at higher frequencies requires more D.–C. power, and therefore maximum gain is attained at the expense of efficiency.

As mentioned previously, the piezoelectric slab is preferably $x$-cut quartz, while the semi-conductor is preferably n-type. It is possible to use a p-type semi-conductor, but, because of its generally lower mobility and conductivity, a p-type semi-conductor will usually have inferior gain characteristics. In either case, silicon or germanium semi-conductors will usually have characteristics that are compatible with the use of a quartz slab. It should be pointed out that in a p-type semi-conductor, the current carriers (holes) travel from a positive potential to a negative potential. The output end of the semi-conductive film should therefore be biased negatively with respect to the input end (opposite that shown in FIG. 1) so that the current carriers travel in the same direction as the acoustic wave. The gain calculations are similar to those of the n-type case. It is also possible, and in some cases may even be desirable, to use an A.–C. cut piezoelectric slab rather than an $x$-cut slab. Generally, excitation of a transverse acoustic wave in an A.–C. cut slab is more difficult than the longitudinal wave in an $x$-cut slab. The transverse wave, however, generally travels at a lower velocity in which case the voltage across the semi-conductor can be reduced.

The efficiency of the device depends primarily on the thickness of the acoustic beam and its proximity to the semi-conductive film. It is possible, by methods known in the art, to force the acoustic wave to propagate along the plane surface 23 of slab 11. The acoustic wave then propagates as a surface wave, or Rayleigh wave, as discussed in the book, Physical Acoustics and the Properties of Solids, by Mason, p. 17 (D. Van Nostrand Company, 1958). Since surface 23 confines the acoustic wave energy and is contiguous with semi-conductor 21, high efficiency amplification can be attained.

FIG. 2 illustrates another embodiment of my invention that can be used for attaining high efficiency amplification. The various elements of the device of FIG. 2 perform essentially the same functions as those of the device of FIG. 1 and have been referenced accordingly. The end portions 25 and 26 of slab 11 are, however, curved, as are the uppermost portions 27 and 28 of central conductors 15 and 16 adjacent end portions 25 and 26.

Because of the corresponding shapes of the end portion 25 and the uppermost portion 27, an acoustic wave is evenly excited in slab 11 upon the excitation of resonator 12. Each portion 25, however, acts as a lens to concentrate the acoustic energy to a narrow acoustic beam 29, indicated by the dotted line. The lower portion of slab 11 is cut away so that surface 23 approximately defines one boundary of acoustic beam 29. In this manner, the acoustic wave is concentrated in close proximity to semi-conductor 21 so that highly efficient interaction can take place.

From the foregoing, one can appreciate the utility of the invention as a means for directly amplifying microwave frequency acoustic waves. Because these waves are amplified directly, the problems of amplifying microwave frequency electromagnetic waves, and exciting high power acoustic waves therewith, are eliminated. Moreover, because of its simplicity and high efficiency, the invention can be economically substituted for more cumbersome electromagnetic wave amplifiers.

It should be understood that the foregoing embodiments are merely illustrative of my inventive concept. Various other arrangements may be devised by those skilled in the art without departing from the spirit and scope of this invention.

What is claimed is:

1. An amplifier comprising a piezoelectric slab, a semiconductive film contiguous with and extending along one side of said slab, means for introducing an acoustic wave to an input end of said slab, means for extracting said acoustic wave from an output end of said slab, and a means comprising a D.–C. voltage source for causing electrons in said film to flow in the same direction as said acoustic wave whereby electric fields accompanying the acoustic wave are caused to couple with electric fields accompanying the electron flow, said coupling being characterized by a gain in decibels of the acoustic wave substantially equal to $$\frac{\sigma A' k^2}{\epsilon A (v_0 - v_s)}$$

where $\sigma$ is the conductivity of the semi-conductor, A' is the thickness of the film, $k$ is the electromechanical coupling constant of the piezoelectric slab, $\epsilon$ is the dielectric constant of the piezoelectric slab, A is the thickness of the slab, $v_s$ is the phase velocity of the acoustic wave, and $v_0$ is the velocity of the electron flow which is equal to $$\frac{\mu V}{L}$$

where $\mu$ is the mobility of the semi-conductor, L is the length of the semi-conductor, and V is the voltage produced by said voltage source, said voltage being adjusted with respect to said mobility, length, thickness, electromechanical coupling constant, and conductivity such that the ratio $v_0/v_s$ is in the range of 1.1 to 1.5.

2. A traveling wave amplifier comprising an $x$-cut piezoelectric slab having an input end portion and an output end portion, means adjacent the input end portion for exciting an acoustic wave in said slab, said input end portion being convex whereby said acoustic wave is focused into a narrow acoustic beam, one side of said slab being cut to border upon said focused acoustic beam, a semi-conductive film extending along said one side of the slab in close proximity to the acoustic beam, means for establishing a D.–C. bias across said film, and means adjacent the output end portion of the slab for extracting the acoustic wave.

3. In combination: an elongated piezoelectric element, means for exciting in the piezoelectric element acoustic wave energy at a predetermined frequency to propagate in a predetermined direction, an elongated semiconductive element contiguous with one side of the piezoelectric element, means for increasing the acoustic wave energy at said predetermined frequency in the piezoelectric element, said last-mentioned means comprising means for causing current carriers to flow in the semiconductive element in the same direction as the acoustic wave propagation.

4. The combination of claim 3 wherein the means for causing current carriers to flow comprises a voltage source connected to the semiconductive element.

5. In combination: an elongated piezoelectric element, means for exciting acoustic wave energy within the frequency range of 1 to 10 kilomegacycles per second in the element to propagate in a predetermined direction, an elongated semiconductive element contiguous with one side of the piezoelectric element, means for increasing the acoustic wave energy within the piezoelectric element, said last-mentioned means comprising means for causing current carriers to flow in the semiconductive element in the same direction as the acoustic wave propagation, the ratio of the current carrier flow velocity to the acoustic wave phase velocity being in the range of 1.1 to 1.5.

6. The combination of claim 5 wherein the means for causing current carriers to flow comprises a voltage source connected to the semiconductive element.

7. In combination: an X-cut piezoelectric slab having an input end and an output end, means for exciting in the piezoelectric slab acoustic wave energy at a predetermined frequency to propagate from the input end to the output end, a semiconductive film contiguous with one side of the slab, means for increasing the acoustic wave energy at said predetermined frequency in the piezoelectric slab, said last-mentioned means comprising means for causing current carriers to flow in the semiconductive film in the same direction as the acoustic wave propagation at a slightly higher velocity than the acoustic wave propagation velocity.

8. In combination: an elongated piezoelectric element having an input end and an output end, means for exciting in the piezoelectric element acoustic wave energy to propagate from the input end to the output end, an elongated n-type semiconductive element contiguous with one side of the piezoelectric element, means for increasing the acoustic wave energy in the piezoelectric element, said last-mentioned means comprising means for biasing the end of the film nearest the output end of the piezoelectric element at a positive D.-C. potential with respect to the end of the film nearest the input end of the piezoelectric element.

References Cited in the file of this patent

UNITED STATES PATENTS

| | | |
|---|---|---|
| 2,898,477 | Hoesterey | Aug. 4, 1959 |
| 2,951,168 | Yando | Aug. 30, 1960 |
| 3,012,204 | Dransfeld | Dec. 5, 1961 |
| 3,012,211 | Mason | Dec. 5, 1961 |